US005623355A

United States Patent [19]
Olsen

[11] Patent Number: 5,623,355
[45] Date of Patent: Apr. 22, 1997

[54] ERROR-RATE-BASED LASER DRIVE CONTROL

[75] Inventor: James J. Olsen, Concord, Mass.

[73] Assignee: Massachusetts Institute of Technology, Cambridge, Mass.

[21] Appl. No.: 397,738

[22] Filed: Feb. 27, 1995

Related U.S. Application Data

[63] Continuation of Ser. No. 125,534, Sep. 22, 1993, abandoned.

[51] Int. Cl.$^6$ .................................................. H04B 10/08
[52] U.S. Cl. ........................ 359/110; 359/161; 359/187; 371/5.1; 455/69
[58] Field of Search .................................... 359/110, 113, 359/143, 152–154, 161, 177, 180, 187, 194; 371/5.1, 5.5; 372/29; 455/69

[56] References Cited

U.S. PATENT DOCUMENTS

| | | | |
|---|---|---|---|
| 4,412,331 | 10/1983 | Chapman | 372/29 |
| 4,553,268 | 11/1985 | Tilly | 359/152 |
| 4,701,923 | 10/1987 | Fukasawa et al. | 371/5.5 |
| 5,267,068 | 11/1993 | Torihata | 359/110 |

FOREIGN PATENT DOCUMENTS

| | | | |
|---|---|---|---|
| 0331255A2 | 9/1989 | European Pat. Off. | H04B 9/00 |
| 0433481A1 | 6/1991 | European Pat. Off. | H04B 10/14 |
| 61-012138 | 1/1986 | Japan | H04B 9/00 |
| 61-164283 | 12/1986 | Japan | H01S 3/133 |
| 0238330 | 9/1989 | Japan | 359/161 |

OTHER PUBLICATIONS

Barfield et al., "Analysis and Simulation of Mode Partition noise in distributed Feedback lasers", Optical Fiber Communication Conference, 1989 Technical Digest Series, vol. 5, Conference Edition p. 125.

Shumate, P.W. Jr. et al., "GaAlAs Laser Transmitter for Lightwave Transmission Systems," *The Bell System Technical Journal*, vol. 57, No. 6, Jul.–Aug. 1978, pp. 1823–1835.

Olsen, James J., "Control and Reliability of Optical Networks in Multiprocessors," PhD. Thesis, May 1993, Chapters 1 (pp. 13–19) and 7 (pp. 66–94), Massachusetts Institute of Technology.

Olshansky, R., et al., "Simultaneous Transmission of 100 Mbit/s at Baseband and 60 FM Video Channels for a Wideband Optical Communication Network," *Electronics Letters*, 24(19):1234–1235 (15 Sep. 1988).

Fischer, U., "10 Gbit/s Transmission Over 69 km of Non-Dispersion–Shifted Singlemode Fibre with CPFSK Direct Modulation of 1.55 μm BH DFB Laser," *Electronics Letters*, 28(14):1305–1306 (2 Jul. 1992).

*Primary Examiner*—Wellington Chin
*Assistant Examiner*—Kinfe-Michael Negash
*Attorney, Agent, or Firm*—Hamilton, Brook, Smith & Reynolds, P.C.

[57] ABSTRACT

A laser data transfer system includes a laser for transmitting data, a communication link and a receiver which detects light transferred over the link and monitors the data encoded by the light for transmission errors. There are numerous causes for transmission errors, including: laser fatigue due to aging, fluctuations in temperature, a partially or fully occluded optical data path, or a laser lens which is out of focus. The receiver compensates for these errors by communicating occurrences to the transmitting processor which reacts by adjusting the laser drive current.

22 Claims, 4 Drawing Sheets

ERROR-RATE-BASED LASER DRIVE CONTROL

GOVERNMENT FUNDING

This invention was made with Government support under Contract Number F19628-90-C-0002 awarded by the Department of the Air Force. The Government has certain rights in the invention.

RELATED APPLICATION

This application is a continuation of application Ser. No. 08/125,534 filed on Sep. 22, 1993 now abandoned.

BACKGROUND OF THE INVENTION

Optical data communication systems rely heavily on semiconductor lasers as optical sources. Such lasers present a number of reliability problems. In the field of telecommunications, where lasers have become quite popular, many of these problems have been resolved.

As a laser ages, it fatigues and becomes less efficient. More power is then required to drive the communication link. Temperature variations can also affect the laser's ability to drive the channel. A laser which is running hot requires more power for proper operation.

The simplest approach to resolving these problems is to fix the laser drive current at a level which provides acceptable performance over expected laser temperature extremes and expected laser lifetime. The problem with this approach is that higher drive current levels hasten laser fatigue, resulting in premature aging. Elevated drive current also increases temperature levels, which can shorten component lifetimes.

Another solution, widely used in telecommunication networks, employs an analog feedback loop to control the laser drive current. A photodetector, mounted in close proximity to the laser source, monitors the laser light as it is emitted. The photodetector generates an analog signal proportional to the intensity of the laser light. This signal is amplified and fed back to adjust the laser drive current.

Recent advances in optical technology suggest that optical channel interconnects will soon be viable for use in massively parallel processing systems. Such systems require large laser arrays to provide for interprocessor communication. Designers of these systems are inclined to borrow from existing telecommunication technology.

SUMMARY OF THE INVENTION

Analog feedback drive current controllers are not practical for use in systems which involve massively parallel optical data channels. For very wide channels, redundant use of photodetectors and feedback circuitry would consume space and power which otherwise would be available for additional circuitry. Neither of the above drive control methods is capable of detecting a communication link anomaly, such as a partial or complete blockage in an optical path or a lens that is out of focus.

The present invention is directed to a laser data transfer system and method for controlling laser drive current by monitoring transmission errors. The system includes a laser used for transmitting data, a communication link and a receiver which detects light from the laser passed through the communication link. The receiver detects errors in the transmitted data and communicates with the transmitter for controlling drive to the laser based on the occurrence of data errors.

Drive current may be adjusted based on transmission error rate. An error rate above allowed limits indicates that the drive current should be increased. An error rate below allowed limits indicates that the drive current should be decreased. Error rate may be controlled by the receiver, and that rate may be sent to the transmitter for a control decision. Alternatively, a simple control command may be sent to the transmitter.

Error detection may be embedded in an error correction process. In that case, retransmission of data would not be required, but the laser drive would be controlled to minimize the correction rate as well as the possibility of larger errors than can be handled by the correction system.

This system eliminates the need for extraneous feedback circuitry which consumes board space and power, while still providing adequate laser drive current control. This system compensates for laser fatigue and temperature fluctuations and, unlike prior systems, can detect communication link anomalies.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
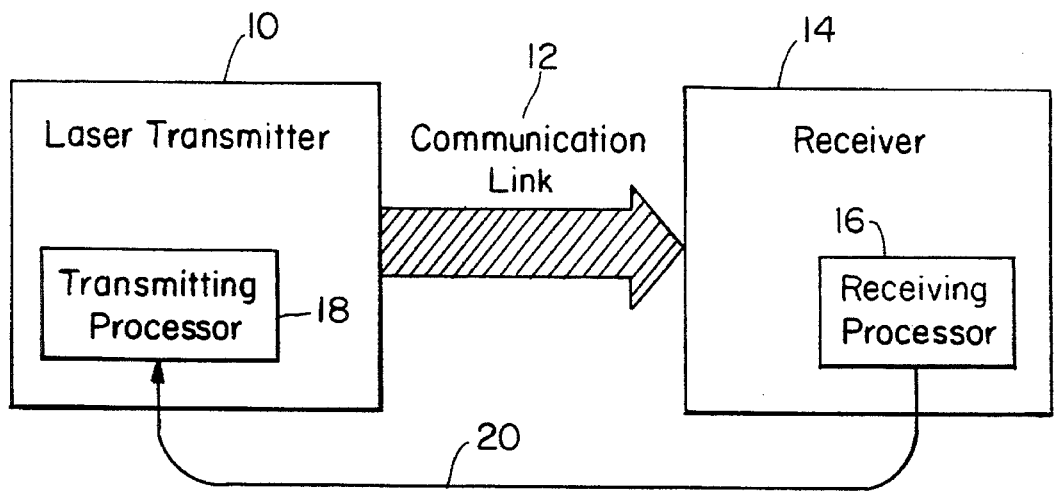
FIG. 1 schematically depicts the major components of a laser data transfer system with software-based laser drive current control.

FIG. 1 is a block diagram of a laser data transfer system in accordance with the present invention. The system includes a laser transmitter 10 for producing a stream of light encoded binary data which is passed over a communication link 12 to a data receiver 14. The data receiver 14 detects errors in the data transmitted by the laser light and uses the receiving processor 16 to communicate an error signal 20 back to the transmitting processor 18. The transmitting processor 18 processes the error signal 20 and compensates for the error.

Figure 2:
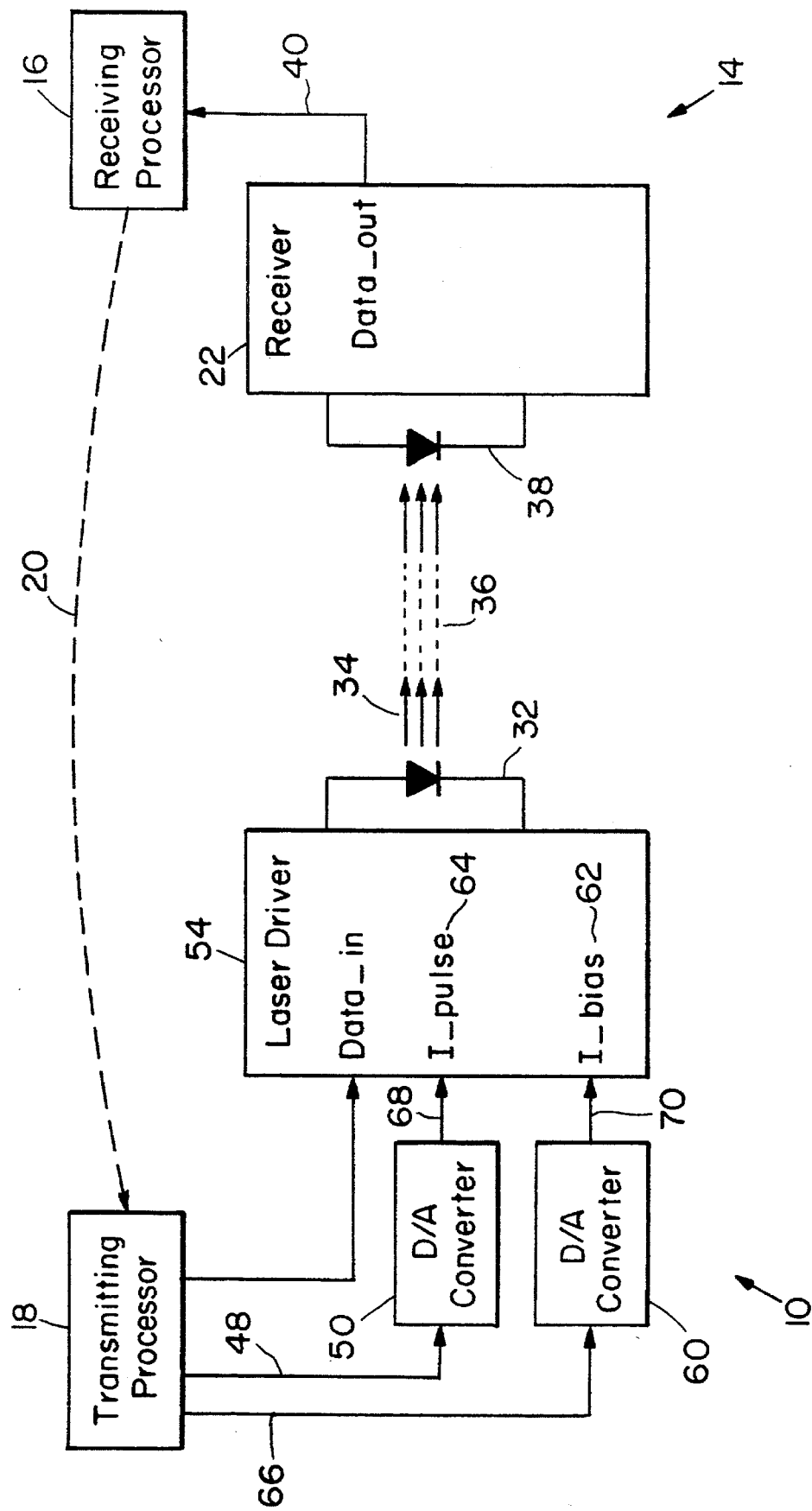
FIG. 2 schematically depicts a preferred embodiment of a laser data transfer system with software-based laser drive current control.

A preferred embodiment of the laser data transfer system is illustrated in FIG. 2. The entire system is digital, with the exception of the laser driver 54 itself and the digital-to-analog (D/A) converters 50, 60 controlling it.

The transmitting processor 18 produces a serial stream of error detection encoded binary data 30 which is sent to the laser driver 54. The laser diode 32 converts the binary data 30 from electrical energy into light energy 34 which is channeled over an optical medium 36 to the receiver 22. A photosensitive diode 38 reconverts the light encoded data 34 from light energy to electrical energy. The reconverted data 40 is then passed to the receiving processor 16.

The receiving processor 16 checks the data for errors and communicates transmission error occurrences to the transmitting processor 18 by sending an error signal 20. The error signal may be returned with each error, or the receiving processor 16 may compute an error rate and occasionally return the rate or a laser drive command to the transmitting processor 18. The error signal 20 can be sent by any of the several methods of interprocessor communication, including shared memory, interrupt, shared stack, shared data bus, serial port, parallel port, or optical link. The transmitting processor 18 processes the error signal 20 and compensates for the error.

After receiving an error signal, the transmitting processor 18 may choose to compensate by adjusting the laser drive current to an appropriate level. Laser drive current is a combination of the laser pulse current 64 and the laser bias current 62. The transmitting processor 18 may also resend the data which was erroneously transmitted.

The transmitting processor 18 controls the laser bias current 62 by programming a digital-to-analog converter 60 which in turn produces an analog signal for the proper laser bias current level 62. The transmitting processor 18 sends a binary word 66 to the digital-to-analog converter 60 which quantizes the binary word 66, producing an analog voltage level 70. The analog voltage level 70 is used by the laser driver 54 in controlling the laser bias current 62. The laser pulse current 64 would be adjusted in a similar fashion.

Many factors contribute to high error rates, including: age of the laser driver 54, temperature fluctuations and degradation of the optical path 36. The transmitting processor 18 compensates for high error rates by elevating the laser drive current. The higher drive current produces a stronger, more reliable laser light signal 34. A low transmission error rate indicates that the channel may operate with reduced laser drive current. By reducing the laser drive current, the power consumption of the transmitter 10 is decreased, conserving power and extending the life of the laser diode 32.

To transmit data via a laser, one may employ any of a number of modulation techniques, such as frequency, phase, or amplitude modulation. The preferred embodiment uses the simplest, most widely used laser modulation method: on-off signalling.

Figure 3:
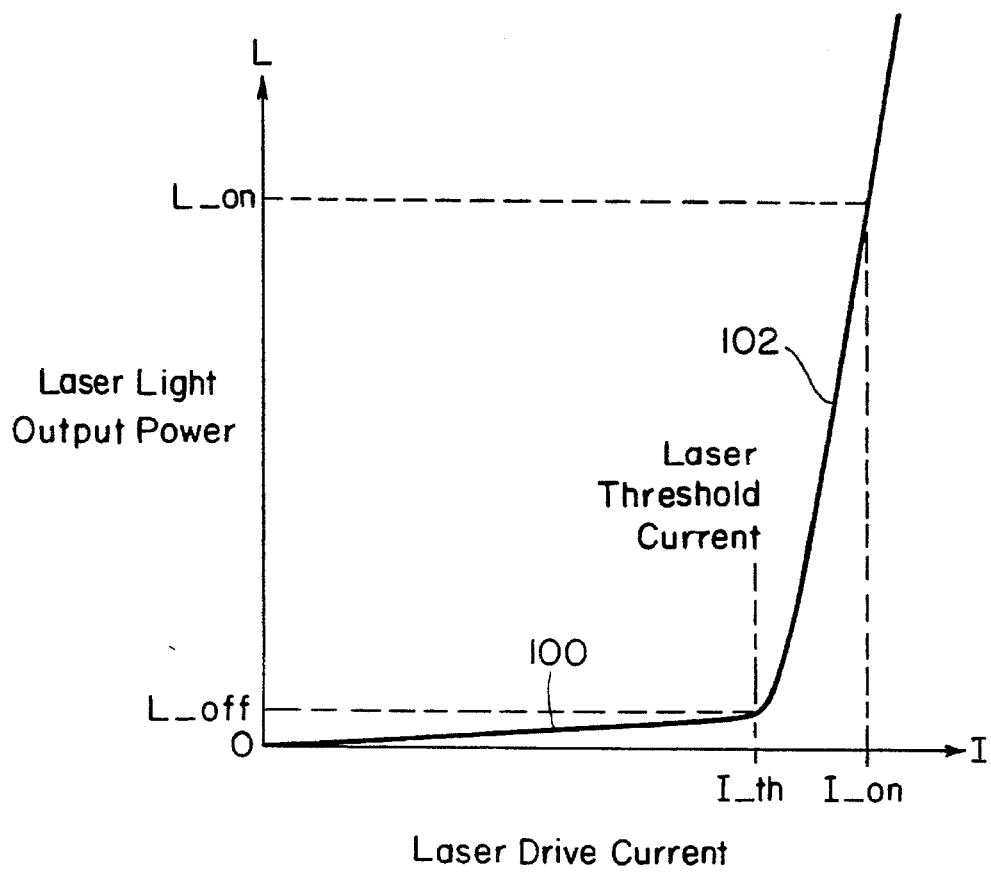
FIG. 3 is a plot of the relationship between laser drive current and laser light output power for a semiconductor laser.

FIG. 3 graphically depicts the relationship between laser drive current, on the I axis, and laser light output power, on the L axis, for a semiconductor laser. To achieve the desired laser light output power level L_on or "laser light on" the laser drive current must be raised to a corresponding current level I_on.

The level for L_off or "laser light off" must be distinguishable from the L_on level. The easiest method for setting the laser light to "off", would simply involve setting the drive current to zero. However, this solution is not practical for use in high speed applications, since the laser output will take considerable time to increase from zero light to the level corresponding to I_th or "threshold current". The laser operates as a light emitting diode for drive currents less than I_th 100. Once drive current is raised above I_th, lasing commences at 102. Therefore, high speed operation requires that a bias current I_bias be applied to the laser, so that it never operates in the light emitting diode realm, and is continuously able to lase. In a preferred embodiment I_bias would be set at I_th so that the corresponding level for L_off is at the threshold for lasing.

Figure 4:
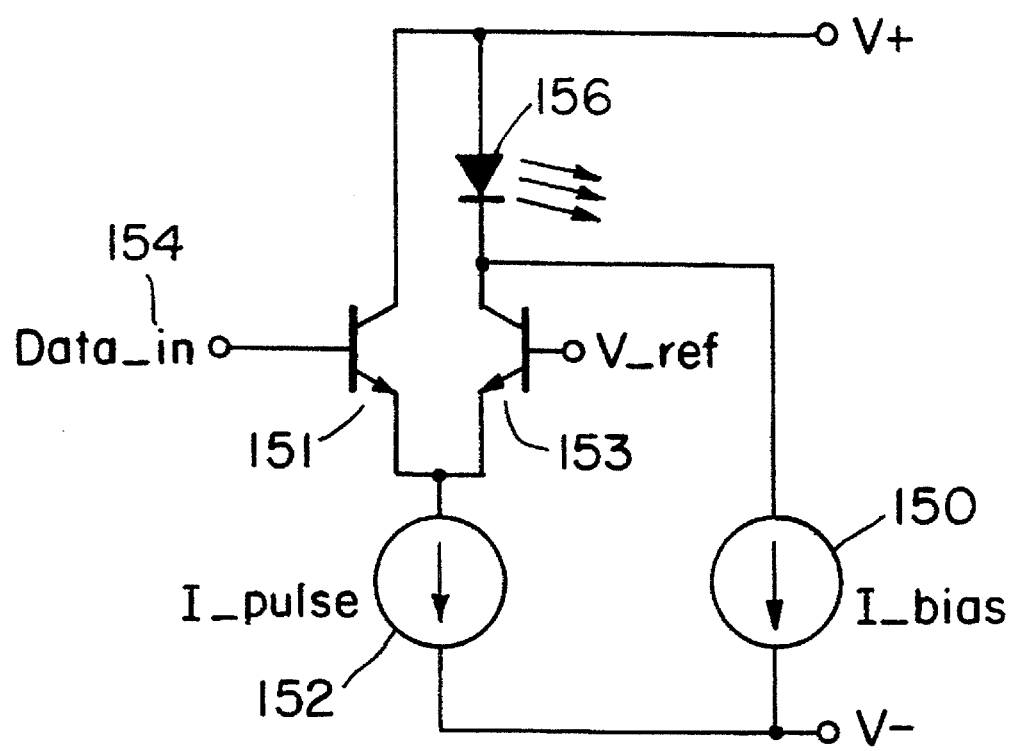
FIG. 4 schematically depicts a semiconductor laser drive current control circuit.

FIG. 4 schematically depicts a laser drive circuit which satisfies the constraints discussed above. The current source I_bias 150 is constantly applied to the laser diode 156 and the current source I_pulse 152 is applied depending on the input data Data_in 154. When Data_in is high, transistor 151 conducts and transistor 153 turns off, so diode 156 does not lase. When Data_in is low, transistor 151 is off, transistor 153 is on and the diode lases. When the laser is emitting light at an intensity level which would be considered "on", a current equal to I_on is flowing through the laser diode 156, with I_bias 150 and I_pulse 152 both contributing to I_on. When the laser is operating at the intensity level "off", the current I_off is flowing through the laser diode 156. I_bias 150 alone contributes to I_off, exclusive of I_pulse 152. The following equations describe how I_bias 150 and I_pulse 152 contribute to laser intensity levels:

I_off=I_bias

I_on=I_bias+I_pulse

Laser wear out failures can be modeled as a gradual increase in laser threshold current over time. As the laser ages, it fatigues, resulting in a decrease in laser light output unless the laser drive circuit compensates by increasing the drive current to the new lasing threshold level. Each individual laser driver has its own unique threshold current level.

There is also a more immediate laser threshold current problem: temperature dependence. Laser threshold current increases exponentially with temperature, so the controller must compensate for this as well.

In a wide data channel with many optical data links operating in parallel, there can be significant non-uniformity in the characteristics of the various links which form the channel. One must cope not only with device variations due to age and temperature, but also with inherent variations among the links which comprise the channel. With the fixed-current method of laser drive control, the drive current must be set to accommodate the hottest, oldest and weakest link that is likely to be used during channel operation. The software-based method of drive control disclosed here, in addition to its other advantages, allows for individual control of each link, and therefore can compensate for individual link variations without having to change the drive level for the entire channel.

In the preferred embodiment, software running on the receiving processor 16 monitors the communication link error performance to make decisions regarding laser drive current levels. The algorithm operates according to a simple rule: if the measured error rate is below threshold error rate, then decrease the drive current; if the measured error rate is above threshold error rate, then increase the drive current. When making adjustments, the feedback algorithm treats bias and pulse currents equally. However, more sophisticated software could adjust them individually with greater precision. For example, when faced with an excessively high error rate, the software could assume that only the bias current need be increased, and proceed to increase the pulse current only if the bias current increase does not resolve the problem. Sophisticated control software may decrease the drive current in response to an increased error rate, or vice-versa, if the situation arose where the light power output was so high that the receiver was over-driven.

Figure 5:
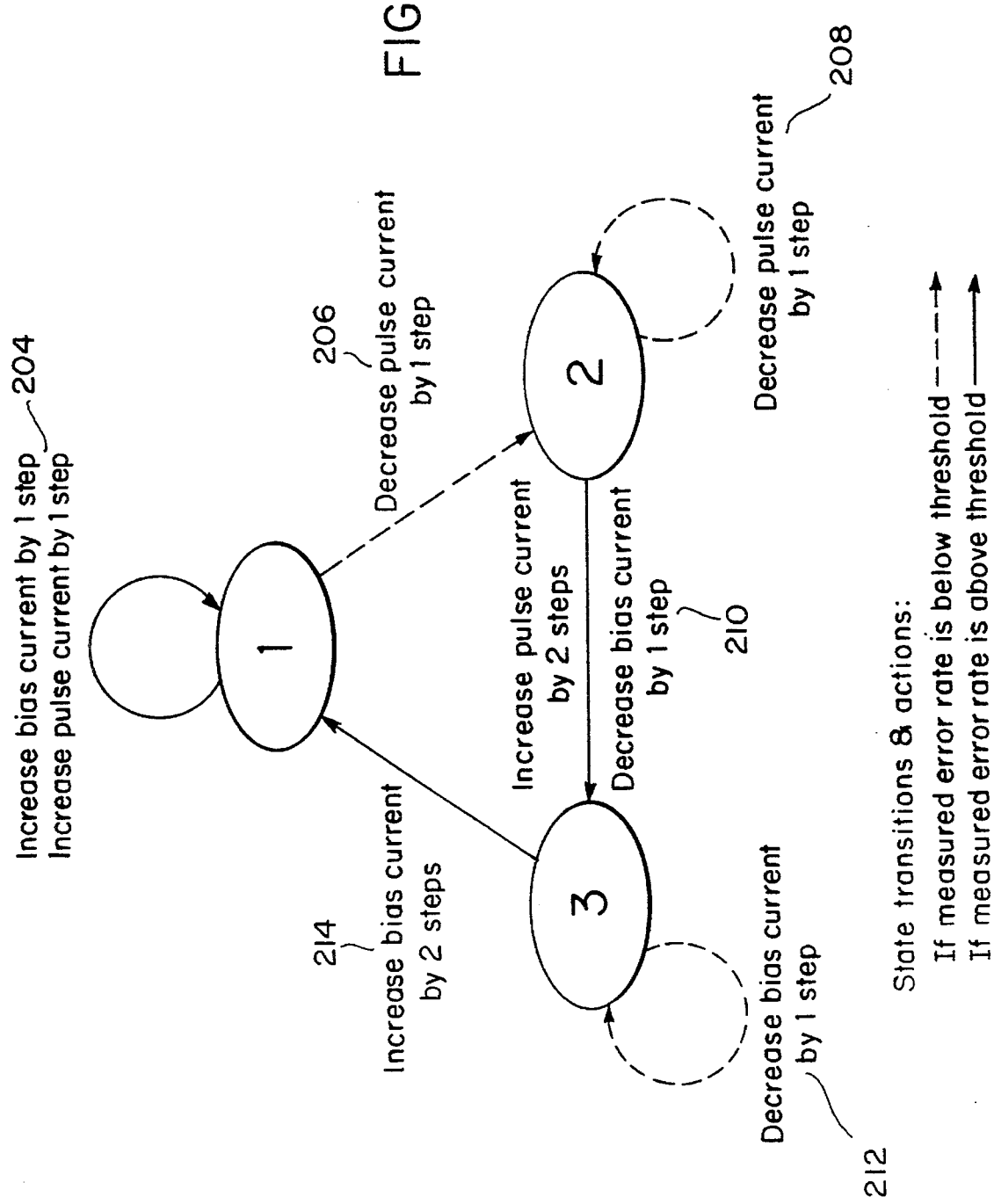
FIG. 5 is a state flow diagram for semiconductor laser drive control software.

FIG. 5 depicts a flow diagram for the drive current control algorithm. The program increases or decreases the bias and pulse currents depending on the performance of the bit error rate. An acceptable threshold for bit error rate is unique to each system. The bit error rate may be monitored periodically, either frequently or infrequently, depending on system requirements. For the preferred embodiment, one current step represents approximately 1% of the normal operating level.

Beginning in State 1, if measured error rate is greater than the threshold error rate, then the bias current and pulse current levels are increased by one step 204. The increase continues, step by step, until the measured error rate equals the threshold error rate, at which time, the pulse current is decreased by one step 206 and State 2 becomes active, with State 1 becoming inactive.

While in State 2, the pulse current is decreased one step at a time 208 until the measured error rate becomes too high. When the measured error rate becomes greater than the threshold error rate, the pulse current is increased by 2 steps and the bias current is decreased by one step 210. State 2 then becomes inactive, and State 3 is activated.

While in State 3, if the measured error rate is less than the threshold error rate then the bias current is decreased by one step 212. This continues, one step at a time, until the measured error rate once again becomes too high, at which point the bias current is increased by two steps 214, State 3 is deactivated, State 1 again becomes active, and the process starts all over again.

This algorithm assures that the laser is operating with just enough bias current and pulse current to keep the measured error rates within tolerable limits. This method is energy efficient, limiting extraneous power consumption. This method also increases component lifetime. Reduced current levels result in lower component temperatures, which can have a positive impact on the lifetime of the laser and any surrounding circuitry.

Another embodiment may employ error correction techniques in providing feedback to the laser drive controller. In that case, minimization of the correction rate, rather than the error rate, would be the primary factor in making drive current control decisions. With data correction, retransmission of the data would not be required.

Drive current control decisions may be based on many factors including: occurrence of a single error, occurrence of multiple errors, error rate, and correction rate. Error rate may be calculated by the receiving processor 16 and that rate could be sent 20 to the transmitting processor 18 for a control decision. Alternatively, the receiving processor 16, if programmed to make control decisions, could send a simple control command 20 to the transmitting processor 18, which would act on that command. Error rate could be calculated by the transmitting processor 18, if the receiving processor 16 were programmed to send an error signal 20 when a single error or multiple errors occurred.

This laser current drive control method is software dependent, unlike the existing hardware-based analog feedback drive control method. The analog feedback loop is an excellent approach for telecommunications applications, where the size, optical complexity, and expense of such a feedback loop is easily absorbed in an already large and expensive support system for each laser.

However, the multiprocessor context is different. When one considers the use of dozens of lasers on each channel, and many thousands of lasers in each system, the complexity and size of each laser link becomes much more relevant. Implementation of an analog feedback loop in a multiprocessor network would require an oppressive hardware overhead. Fortunately, we can exploit the software based laser drive control method previously described by applying it in a massively parallel environment.

By virtue of the fact that the feedback loop comprises both the transmitter 10 and receiver 14, this software-based laser drive control method is capable of detecting communication link anomalies, unlike the hardware-based analog feedback loop method. The software-based system is capable of detecting partial or full occlusions in the optical link, a laser lens which is out of focus, and many other optical link problems.

The addition of the two digital-to-analog converters 50, 60 may seem like a significant increase in complexity, but this application is particularly undemanding for the digital-to-analog converters 50, 60, requiring neither high speed, nor high precision, nor high accuracy. They are easily implemented in large quantities using very-large-scale-integration (VLSI) integrated circuit technology. As space and power consumption concerns are minimal, they lend themselves well to use in a massively parallel semiconductor laser array.

Further details of an initial implementation of the invention can be found in the Massachusetts Institute of Technology Ph.D. Thesis of James J. Olsen, 1993, which is incorporated herein by reference.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A data transfer system comprising:

a transmitter having a laser for transmitting data, said data being encoded for error correction;

a communication link;

a receiver for detecting light from the laser through the communication link; and a processor for detecting data with error correction and for detecting data error rate in data transmitted by the laser light, the processor communicating with the transmitter such that the data error rate controls drive current to the laser during data transmission.

2. A data transfer system as claimed in claim 1 wherein drive current to the laser is increased with increased data error rate.

3. A data transfer system as claimed in claim 2 wherein drive current to the laser is decreased to a level which provides acceptable data error rate.

4. A data transfer system as claimed in claim 1 wherein the receiver communicates error rate to the transmitter for controlling drive current to the laser.

5. A data transfer system as claimed in claim 1 wherein the laser is operated at a drive current level which is less than that required for elimination of transmission errors.

6. A data transfer system as claimed in claim 1 wherein the laser is operated at a drive current level which is less than that required for elimination of transmission errors.

7. The system of claim 1 wherein the processor controls drive current to the laser without regard to the detected light level.

8. A method of transferring data in a data transfer system, comprising the steps of:

transmitting data by laser over a communication link to a receiver;

detecting the communicated laser light;

detecting data error rate in the transmitted data; and controlling the laser drive current with the data error rate without regard to the detected light level; such that the system operates with an acceptable error rate regardless of changes in system characteristics which result in a varying relationship between error rate and drive current.

9. A method of transferring data as claimed in claim 8 wherein the step of controlling the laser drive current causes the laser drive current to be increased when error rate increases.

10. A method of transferring data as claimed in claim 7 wherein the step of controlling the laser drive current causes the laser drive current to be decreased to a level which provides acceptable data error rate.

11. A method of transferring data as claimed in claim 6 wherein the receiver communicates error rate to the transmitter for controlling drive current to the laser.

12. A method of transferring data as claimed in claim 6 wherein the data is encoded for error correction to enable the receiver to detect and correct errors in the transmitted data.

13. A method of transferring data as claimed in claim 8 wherein the laser is operated at a drive current level which is less than that required for elimination of transmission errors.

14. A method of transferring data as claimed in claim 8 wherein the step of controlling the laser drive current is in response to the monitoring of data error rate by the receiver during data transmission.

15. A method of transferring data as claimed in claim 13 wherein the data is encoded for error correction to enable the receiver to detect and correct errors in the transmitted data.

16. A method of transferring data as claimed in claim 14 wherein the laser is operated at a drive current level which is less than that required for elimination of transmission errors.

17. A data transfer system comprising:
   a transmitter having a laser for transmitting data encoded for error correction;
   a communication link;
   a receiver for detecting light from the laser through the communication link; and
   a processor for detecting data error rate in data transmitted by the laser light, the processor monitoring data error rate during data transmission and communicating with the transmitter for controlling drive current to the laser during data transmission based on the data error rate, the receiver being able to detect and correct errors in the transmitted data and the laser being operated at a drive current level which is less than that required for elimination of transmission errors; such that the system operates with an acceptable error rate regardless of changes in system characteristics which result in a varying relationship between error rate and drive current.

18. A data transfer system as claimed in claim 17 wherein data error rate controls the drive current to the laser.

19. A method of transferring data in a data transfer system comprising the steps of:
   transmitting data encoded for error correction by laser over a communication link to a receiver;
   detecting the communicated laser light;
   monitoring the data error rate in the transmitted data during data transmission; and
   controlling the laser drive current during data transmission based on data error rate without regard to the detected light intensity level, the receiver detecting and correcting errors in the transmitted data and the laser being operated at a drive current level which is less than that required for elimination of transmission errors; such that the system operates with an acceptable error rate regardless of changes in system characteristics which result in a varying relationship between error rate and drive current.

20. A method of transferring data as claimed in claim 19 wherein the step of controlling further comprises the step of controlling the laser drive current with the data error rate.

21. A data transfer system comprising:
   a transmitter having a laser for transmitting data;
   a communication link;
   a receiver for detecting light from the laser through the communication link; and
   a processor for detecting data error rate in data transmitted by the laser light, the processor communicating with the transmitter for controlling drive current to the laser based solely on the data error rate; such that the system operates with an acceptable error rate regardless of changes in system characteristics which result in a varying relationship between error rate and drive current.

22. A data transfer system comprising:
   a transmitter having a laser for transmitting data;
   a communication link;
   a receiver for detecting light from the laser through the communication link; and
   a processor for detecting data error rate in data transmitted by the laser light, the processor communicating with the transmitter such that the data error rate controls drive current to the laser without regard to the detected light level; such that the system operates with an acceptable error rate regardless of changes in system characteristics which result in a varying relationship between error rate and drive current.

* * * * *

UNITED STATES PATENT AND TRADEMARK OFFICE
CERTIFICATE OF CORRECTION

PATENT NO. : 5,623,355
DATED : April 22, 1997
INVENTOR(S) : James J. Olsen

It is certified that error appears in the above-indentified patent and that said Letters Patent is hereby corrected as shown below:

In claim 10, column 7, line 9, change "claim 7" to ---claim 9---.

In claim 11, column 7, line 13, change "claim 6" to ---claim 8---.

In claim 12, column 7, line 16, change "claim 6" to ---claim 8---.

In claim 15, column 7 line 27, change "claim 13" to ---claim 14---.

Signed and Sealed this

Twenty-sixth Day of August, 1997

Attest:

BRUCE LEHMAN

Attesting Officer

Commissioner of Patents and Trademarks